(12) United States Patent
Phillips

(10) Patent No.: US 9,247,659 B1
(45) Date of Patent: Jan. 26, 2016

(54) SLAB-BASED COOLING

(71) Applicant: Amazon Technologies, Inc., Reno, NV (US)

(72) Inventor: Matthew Thomas Phillips, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 223 days.

(21) Appl. No.: 13/924,100

(22) Filed: Jun. 21, 2013

(51) Int. Cl.
*F25D 23/12* (2006.01)
*H05K 7/20* (2006.01)
*H05K 5/02* (2006.01)

(52) U.S. Cl.
CPC .................................. *H05K 5/02* (2013.01)

(58) Field of Classification Search
CPC ......... H05K 5/02; H05K 7/2079; H05K 7/20; H05K 5/00; H05K 7/207; H05K 5/0021; H05K 5/0004; F25D 23/12
USPC ........... 62/259.2, 515, 335, 434, 56; 361/690, 361/679, 695
See application file for complete search history.

(56) References Cited

U.S. PATENT DOCUMENTS

| | | | |
|---|---|---|---|
| 6,374,627 B1* | 4/2002 | Schumacher et al. | 62/259.2 |
| 7,315,448 B1* | 1/2008 | Bash et al. | 361/701 |
| 2003/0221999 A1* | 12/2003 | Weaver et al. | 209/129 |
| 2007/0171610 A1* | 7/2007 | Lewis | 361/691 |
| 2008/0055846 A1* | 3/2008 | Clidaras et al. | 361/687 |
| 2009/0210096 A1* | 8/2009 | Stack et al. | 700/278 |
| 2009/0241578 A1* | 10/2009 | Carlson et al. | 62/259.2 |
| 2010/0251629 A1* | 10/2010 | Clidaras et al. | 52/79.1 |
| 2011/0174001 A1* | 7/2011 | Carlson et al. | 62/96 |
| 2011/0307102 A1* | 12/2011 | Czamara et al. | 700/277 |
| 2012/0144851 A1* | 6/2012 | Hay | 62/91 |
| 2012/0167600 A1* | 7/2012 | Dunnavant | 62/89 |

* cited by examiner

*Primary Examiner* — Mohammad M Ali
(74) *Attorney, Agent, or Firm* — Lee & Hayes, PLLC

(57) ABSTRACT

Air conditioning systems and techniques are described that include passing a fluid through a slab. The fluid is cooled in the slab and the cooled fluid is circulated to a coil. The coil is arranged in an airflow such that ambient air passes over the coil, thereby reducing the relative humidity of the ambient air. A control unit may also be provided to selectively operate a pump to control the flow of the fluid through the slab.

24 Claims, 7 Drawing Sheets

SLAB-BASED COOLING

BACKGROUND

Electronic components generate heat. In many conventional applications, these heat-generating electronic components are arranged in a room, such as a data center, and that room is cooled to guard against overheating and/or malfunctioning of the components. The burden on cooling systems in data centers has increased. Specifically, as electronic components have become smaller, they are more densely packed into the datacenter. And, as their respective processing power has increased, the amount of heat each generates has also increased.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

This disclosure describes systems and techniques for conditioning air to be introduced into a space, such as a data center. A coil may be disposed in a flow of incoming air to condense moisture, thereby lowering the relative humidity of the air. The dehumidified air may then be passed to an evaporative cooling system that cools the air. The coil may be in fluid communication with a conduit that is at least partly disposed within a slab, such as a slab comprising part of a building foundation. The slab, which may be cooled by its contact with the subsoil, dissipates heat from fluid circulating through the conduit and coil. A pump may be provided to circulate the fluid through the conduit and coil, and in some embodiments, the pump is controlled to regulate the flow of the fluid to maintain a temperature of the fluid. In some embodiments, the pump is controlled to circulate the fluid when conditions of ambient air meet or exceed threshold values and/or when a temperature of the slab is below a threshold. In some embodiments, the slab is a concrete slab and it may form a subflooring of a data center.

Example Data Center

Figure 1:
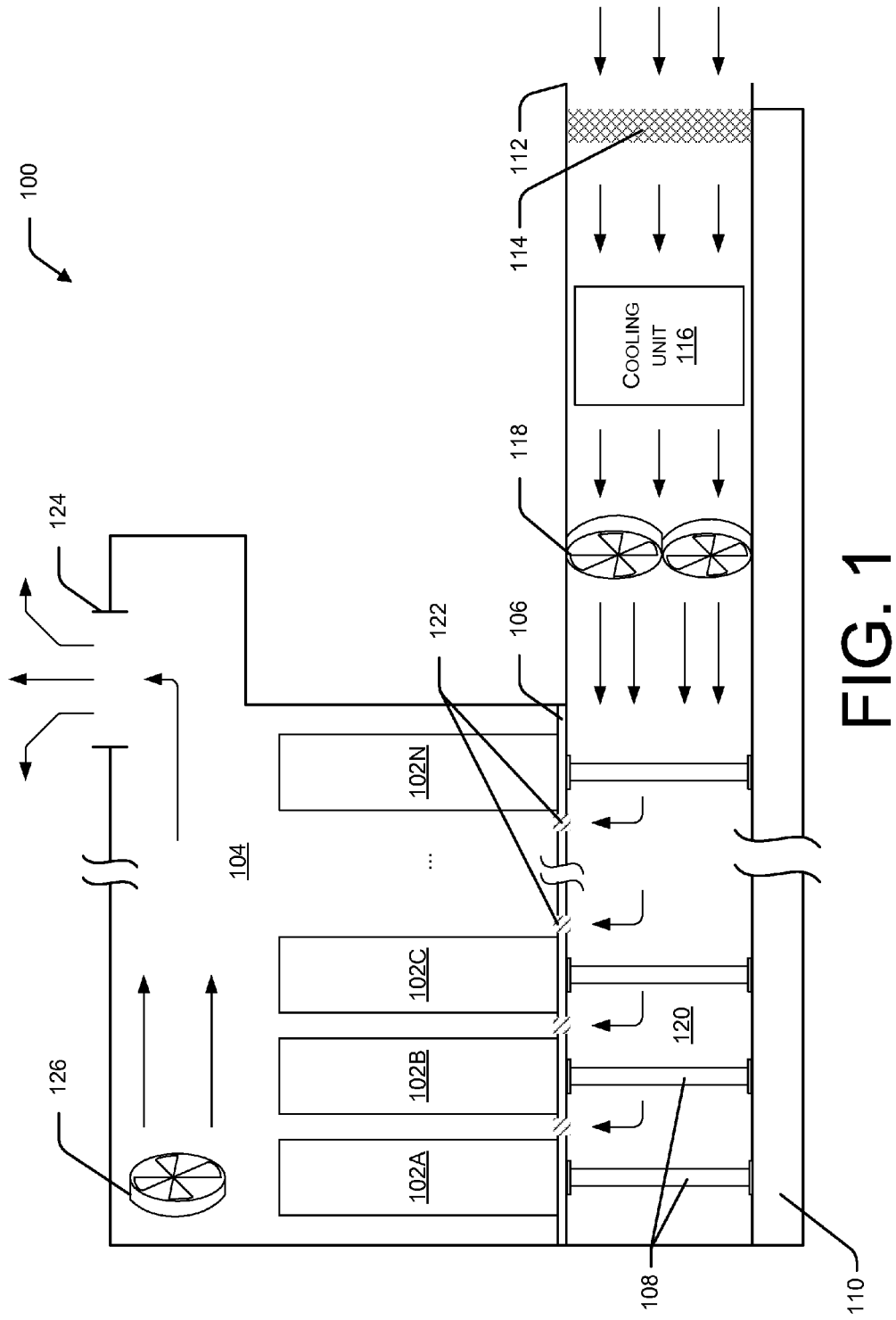
FIG. 1 illustrates a data center including a cooling system for cooling external, ambient air to subsequently introduce that cooled air into a space containing electronic components.

FIG. 1 illustrates an example data center 100 housing a plurality of electronic components 102A, 102B, 102C, . . . , 102N (referred to collectively as components 102) in a main room 104. Each of the components 102 is shown schematically, and may be embodied as a single component or as a plurality of components, for example, stored together on a rack or other support structure. The components 102 may include any heat generating component, including, but not limited to, information technology (IT) infrastructure components, which may include computers, processors, servers, microcontrollers, microcomputers, programmable logic controllers (PLCs), application specific integrated circuit, or other programmable circuits. Other examples of electronic components include e-commerce servers, network devices, telecommunications equipment, electrical power management and/or control devices, medical equipment, and audio equipment. Principles of this disclosure may also be applicable to air conditioning of spaces not housing electronic components, and although description will be made with respect to a data center housing electronic components, the disclosure is not limited to data centers and may be applicable to any space in which air conditioning is required.

As further illustrated in FIG. 1, the electronic components 102 are supported on a floor 106 of the room 104. The floor 106 is supported by a plurality of stanchions 108 in a raised position, relative to a subfloor 110.

The stanchions 108 are preferably steel, or steel-reinforced, load-bearing members, arranged in an array to support the load of the floor 106 and the components 102. In some implementations, the stanchions 108 are bolted or otherwise fastened to the floor 106 and/or subfloor 110.

The subfloor 110 may be a slab provided on a foundation or directly on the subsoil. In one implementation, the slab is a concrete slab, and it may be reinforced, such as by rebar. The slab may be cast or poured in situ, or may be prefabricated for subsequent placement in a desired location, such as for use in a modular structure, such as a data center pod.

Air flow through the data center is generally illustrated by the arrows illustrated in FIG. 1. Specifically, ambient, exterior air enters the data center 100 as source air at an air intake 112. In FIG. 1 a filtration mechanism 114 is disposed at the air intake 112 to remove contaminants or other materials from the incoming air. The filtration mechanism may take any conventional form, generally depending upon the application.

The filtered ambient air then passes to a cooling unit 116 that lowers the temperature of the air, as required. Using intake fans 118 or the like, the cooled air is then blown or otherwise forced into a space 120 bounded by the floor 106 and the subfloor 110 and through vents 122 in the floor 106, into the room 104.

Although FIG. 1 illustrates that the cooled air is forced using one or more intake fans 118, other mechanisms for producing air flow are known and could be used instead of or in addition to the fans 118. Moreover, the position of the intake fans may vary depending upon the application. For instance, one or more intake fans may be provided closer to the air intake 112, e.g., upstream of the cooling unit 116, including at a position exterior to the data center proximate the air intake 112.

The space 120 between the floor 106 and the subfloor 110 may be a plenum, storing the cooled air at an increased pressure.

The vents 122 in the subfloor may be stationary vents, such as grates, or they may be adjustable vents, such as dampers, that are moveable to regulate flow of air therethrough. Adjustable vents or dampers may be utilized to control the flow rates and distribution of cooling air between and among the various electronic components 102. That is, the dampers may be independently operable to selectively allow and prevent air flow therethrough. In some embodiments, the vents 122 may be controlled using a control unit, such as a building automation system (BAS) or a building management system (BMS).

As the cool air enters the room 104 through the vents 122, it passes over the electronic components 102, cooling them. A heat exchange takes place between the components 102 and the air, causing the air to increase in temperature. As the air warms, it rises to the top of the room 104 and is expelled through a discharge 124. Although not required in all embodiments, a discharge fan 126 is also illustrated in FIG. 1 to direct the warm air to the discharge 124.

Although not illustrated in FIG. 1, some or all of the air leaving the system through the discharge 124 may instead be rerouted upstream of the cooling unit 116, for example, via a return.

Example Cooling System Using Evaporative Cooling

Figure 2:
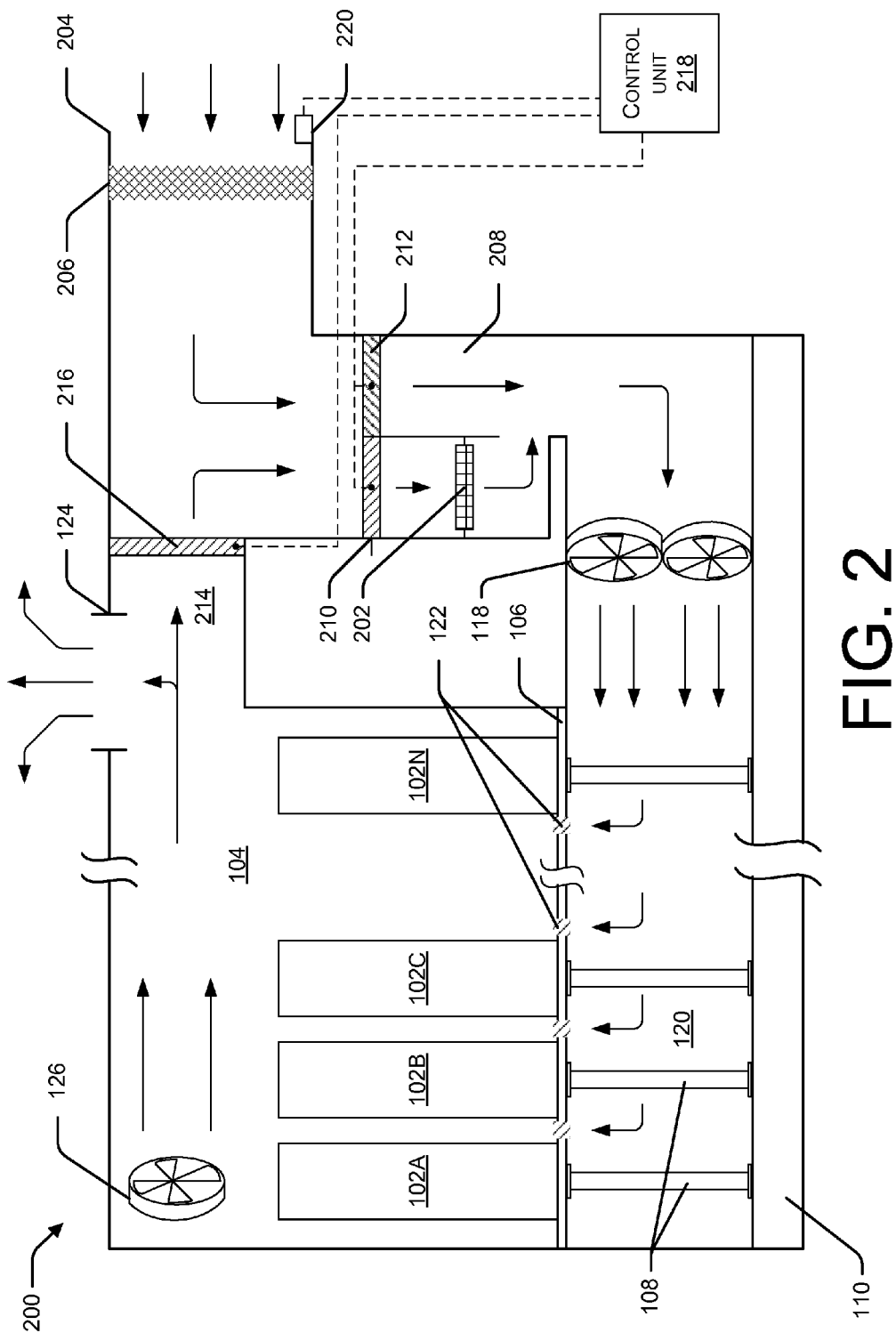
FIG. 2 illustrates a data center including an evaporative cooling system for selectively cooling external, ambient air.

FIG. 2 illustrates a data center 200 similar to the data center 100 of FIG. 1, in which the cooling unit 116 is an evaporative cooler 202. The components of FIG. 2 that are identical to components shown in FIG. 1 (and described in detail above in connection with FIG. 1) are denoted by the same reference numerals in FIG. 2.

Similar to FIG. 1, an air intake 204 and a filtration mechanism 206 in the air intake 204 are provided. Supply air filtered by the filtration mechanism 206 then proceeds to the evaporative cooler 202. At the evaporative cooler, water is cooled by evaporation and it is then forced into the room 104, for example, using fans 118.

Also in FIG. 2, a bypass duct 208 is provided, through which some or all intake air can bypass the evaporative cooler 202. An evaporative cooler damper 210 and a bypass damper 212 also are provided, corresponding, respectively, with the evaporative cooler 202 and the bypass duct 208. The evaporative cooler damper 210 and the bypass damper 212 are selectively positioned to regulate the amount of intake air exposed to the evaporative cooler 202. As user herein a damper is intended generally to refer to any device or component that can control (e.g., by restricting) the flow of fluid through a duct or other passageway. Examples of dampers include plates, blades, panels, discs, or combinations thereof. A damper may include multiple elements. For example, a damper may include a series of plates in parallel relation to one another that can be simultaneously rotated to close a duct.

FIG. 2 also illustrates a return air duct 214 through which air in the room 104 can be reintroduced to the system, for use as intake air, for example, for exposure to the evaporative cooler 202. A return damper 216 is selectively positioned to regulate flow of air through the return air duct 214.

A control unit 218 also is provided in the data center 200, in communication with the evaporative cooler damper 210, the bypass damper 212, the return damper 216, and an air intake sensor 220. The control unit may be a BAS or a BMS, or it may be in communication with a BAS or BMS. Dotted lines are used in the Figures to indicate communication connections between devices and the control unit 218. Such communication connections may be wired or wireless.

In one implementation, the air intake sensor 220 senses the temperature of the air entering the data center 200 and transmits that temperature to the control unit 218. Based on the temperature, the control unit instructs the dampers 210, 212, 216 to regulate flow of air within the system. For example, if the temperature at sensor 220 is determined to be below a threshold value, the evaporative cooler 202 may not be required, because the source air is sufficiently cold to cool the room 104. In such an instance, the bypass damper 212 may be opened to allow unrestricted airflow therethrough, whereas the evaporative cooler damper 210 is closed to prevent air flow to the evaporative cooler 202.

Other sensors may be disposed in the data center 200 and/or in communication with the control unit 220. For example, a temperature sensor may also be disposed in the return air duct 214. When air temperature in the return air duct 216 is below a threshold temperature, for example, it may be desirable to recirculate that air through the system. In this instance, the control unit 218 would open the return damper 216.

The evaporative cooler 202 may be selected because of its relatively low energy consumption relative to conventional refrigeration mechanisms. Evaporative coolers promote an adiabatic process in which water changes phase from liquid water into water vapor. Because water has a relatively large enthalpy of vaporization, the temperature change can be quite dramatic. However, use of evaporative coolers has been limited conventionally, because such coolers are most effective when ambient air has a relatively low humidity. As the humidity of the ambient air increases, evaporative coolers become increasingly less effective.

Example Cooling System with Slab-Based Dehumidification

Figure 3:
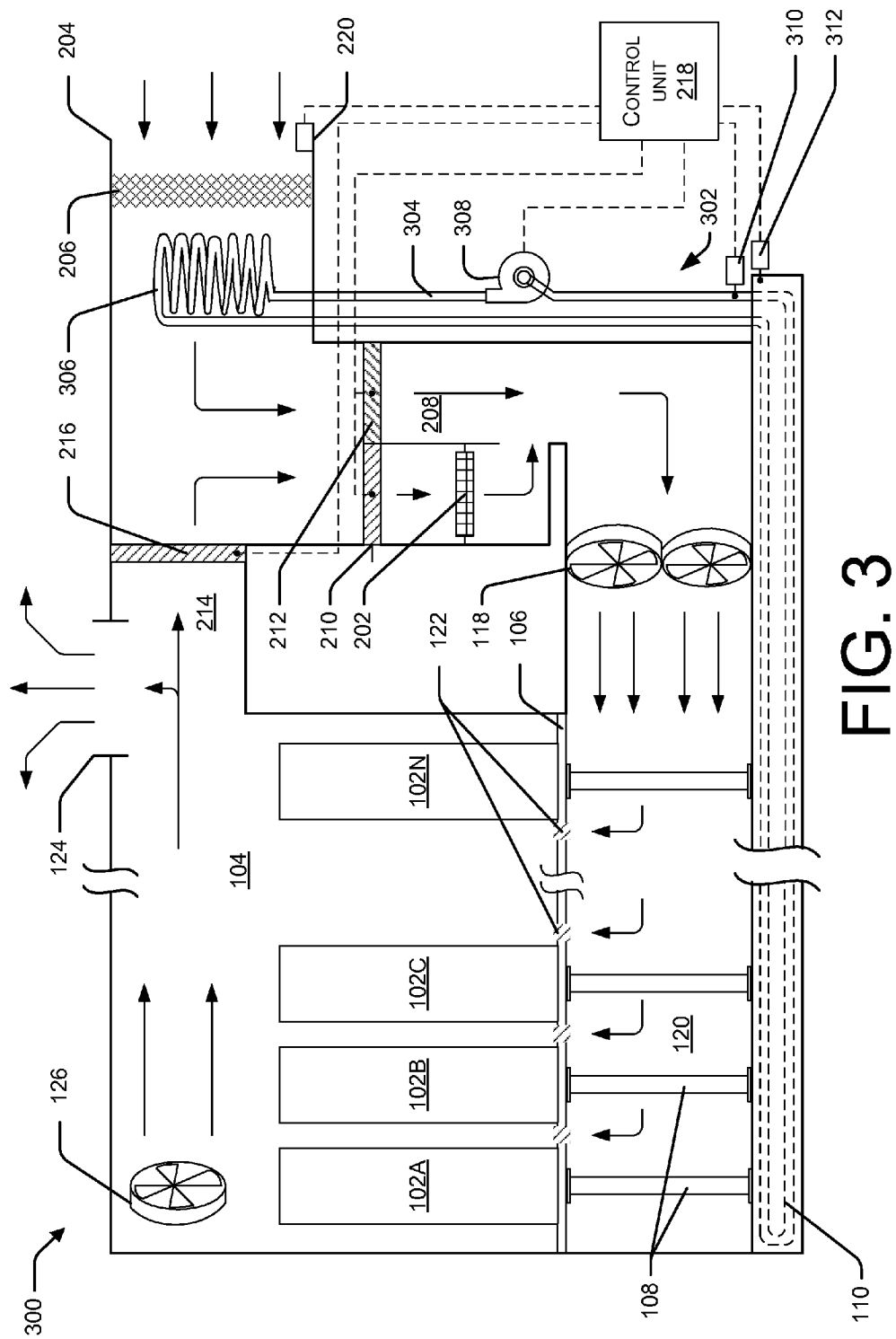
FIG. 3 illustrates an example data center that has an evaporative cooling system and a fluid circulation system. The fluid circulation system includes a coil disposed upstream of the evaporative cooling system and a conduit partially disposed in a building slab in fluid communication with the coil.

FIG. 3 illustrates an example data center 300 configured to lower the relative humidity of ambient, source air prior to exposing that air to an evaporative cooler 202. Several of the components of the data center 300 were described above in detail with reference to FIG. 1 and/or FIG. 2. The components of FIG. 3 that are identical to components shown in FIG. 1 and/or FIG. 2 (and described in detail above in connection with those Figures) are denoted by the same reference numerals in FIG. 3.

The data center 300 includes a fluid conveying system 302. In the illustrated embodiment, the fluid conveying system 302 is a closed fluid loop including piping (embodied as a conduit 304), a coil 306, and a pump 308. The pump 308 conveys a fluid (such as a coolant) through the conduit 304 and the coil 306.

The conduit 304 is at least partly disposed in the subfloor 110. In one implementation, the subfloor 110 is a slab, such as a concrete slab. Concrete may be chosen because concrete slabs are not prone to large temperature swings and they will dissipate heat to the subsurface (e.g., ground or foundation) on which they are constructed. Circulating a fluid coolant, such as water, through the conduit 304 will cause the fluid to cool, i.e., by dissipating heat to the slab. The liquid cooled by the slab is then circulated through the coil 306.

The coil 306 may be a low pressure drop coil, and in the illustrated embodiment is disposed proximate the intake 204 in the intake airstream. Accordingly, entering ambient air passes over the coil 306. As the relatively humid incoming air passes over the coil 306, the coil 306 absorbs latent heat from the air, lowering the air's relative humidity and thus the air's wet bulb temperature. Depending on system parameters, the wet bulb temperature of the incoming air may be lowered to the saturation point. This "dehumidified" supply air is then introduced into the evaporative cooler 202, which cools the air for delivery to the room 104. The temperature change effected by the evaporative cooler 202 depends upon a difference between the dry-bulb and the dew point temperatures of the air and the efficiency of the evaporative media used in the cooler, so lowering the wet bulb temperature at the coil will create a more dramatic temperature change at the evaporative cooler.

Although the coil 306 is illustrated schematically as a single coil, this disclosure is not limited to one coil. In other embodiments, a plurality of coils may be used, and those coils may be arranged in parallel, in series, or in some other arrangement. Coils different from the illustrated helical coil may also be used. For example, an A-frame coil, which has conventional applications in refrigeration-type systems, may be beneficial in some applications. In some implementations, the coil may be embodied as additional or alternative heat transfer structures, such as fins.

As noted, the relative humidity of the incoming air is decreased by the coil 306 when moisture in the air condenses. Although not illustrated, this condensed moisture may be removed proximate the coil 306, for example, via a drain.

The pump 308 circulates the coolant through the loop formed by the conduit 302 and the coil 304. Operation of the pump may be controlled, and in FIG. 3, the pump 308 is illustrated as being in communication with the control unit 218. Accordingly, the control unit 218 selectively operates the pump to control the flow of coolant in the system 302. In some embodiments, the pump 308 is a single speed pump and the control unit 218 turns the pump on to circulate coolant through the coil 306 or off, in which case no coolant passes through the coil 306. In other embodiments, the pump 308 includes a variable frequency drive (VFD) (not shown), which may be controlled by the control unit 218. By modulating the frequency of the VFD, flow of the coolant can be controlled, which in turn may control the temperature of the coolant.

In some embodiments, the control unit 218 controls the pump 308 based on inputs received from the system 302. For example, FIG. 3 also illustrates a coolant sensor 310 and a slab sensor 312 in communication with the control unit 218. The coolant sensor 310 may be disposed in (or in contact with) the conduit 304, and may be configured to sense one or more of temperature and flow characteristics of the coolant. The slab sensor 312 may be embodied as a temperature gauge, to monitor the temperature of the slab. Although only a single coolant sensor 310 and a single slab sensor 312 are illustrated, a plurality of either or both of these sensors may be provided, to obtain more complete information about the system. As discussed above, the air intake sensor 220 may also be in communication with the control unit 218, to provide information about the intake air.

Figure 4:
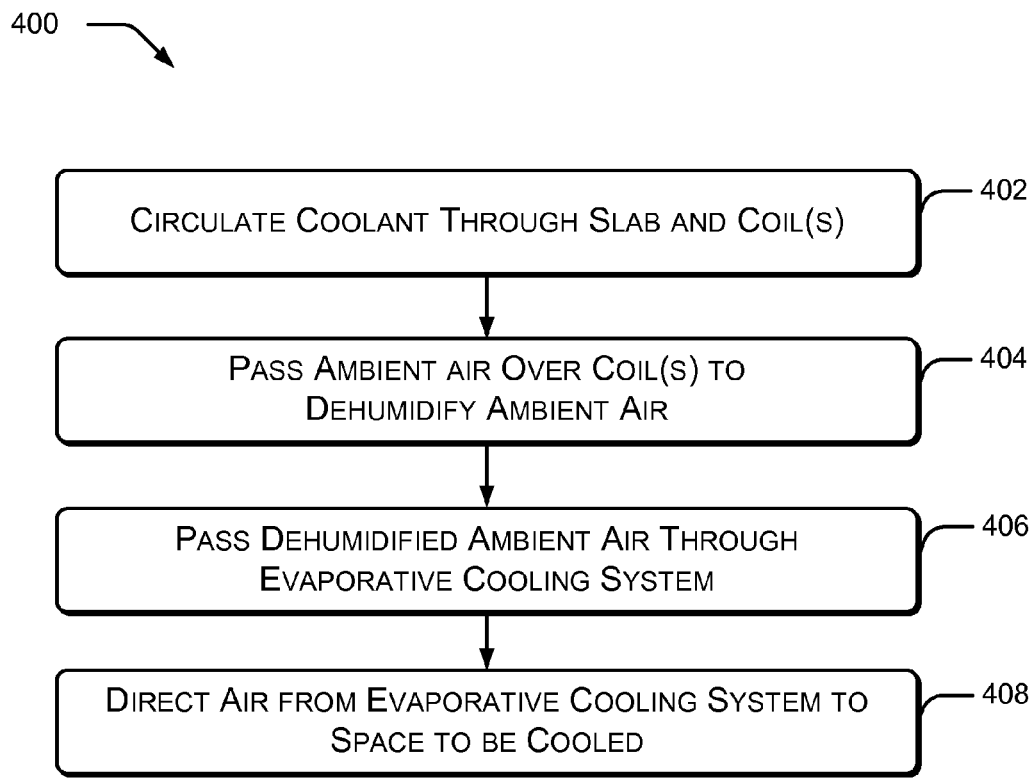
FIG. 4 is a flow diagram demonstrating a process for conditioning air using an evaporative cooling system and a fluid circulation system.

FIG. 4 is a flow chart illustrating an example cooling process 400 in the data center 300, which may be carried out by instructions from the control unit 218.

At block 402, coolant is circulated through the fluid circulating system 302. The coolant's temperature increases proximate the coil, as it condenses moisture from the incoming, humid air, and its temperature decreases as it circulates through the slab 110, via heat dissipation to the slab. Although not illustrated, in implementations of this disclosure, any portion of the conduit 304, such as segments provided between the coil 306 and the slab, may be insulated.

At block 404, ambient air is passed over the coil 306. The ambient air may be external air pulled from the environment around the data center 300, it may be return air, or it may be a combination of both. The relative humidity of the ambient air will decrease proximate the coil as moisture in the air condenses. The temperature, that is, the dry bulb temperature of the air, may increase slightly as moisture condenses at the coil, but the wet bulb temperature will decrease.

At block 406, the dehumidified ambient air is exposed to the evaporative cooling system 202. The evaporative cooling system 202 lowers the temperature of the air, and at block 408, this cooled air is directed to the space to be cooled, such as the room 104 containing the electronic components 102.

In embodiments of this disclosure, the efficiencies of using an evaporative cooler 202 may be realized even in locales where the ambient air is relatively humid. Using the slab, fluid is cooled for use in lowering the humidity of the ambient air.

In some embodiments, the fluid circulating system 302 may have a limited cooling capacity, for example, because the cooling capacity of the slab is finite. As fluid passes through the slab, the slab warms and with prolonged circulation the slab may become saturated. In such an instance, it may be desirable to stop the flow of fluid in the slab, to allow the built-up heat to dissipate into the surroundings, such as into the subsurface. Accordingly, in some implementations the fluid circulating system 302 is only activated under certain circumstances, such as where the ambient air is above a threshold relative humidity or threshold dry bulb temperature. In other instances, heat may be actively dissipated from the slab, for example, by running a cooling fluid through the conduit. This cooling fluid may be the same coolant used to promote condensation at the coil, for example, when the ambient air temperature decreases, such as at night in some climates.

Figure 5:
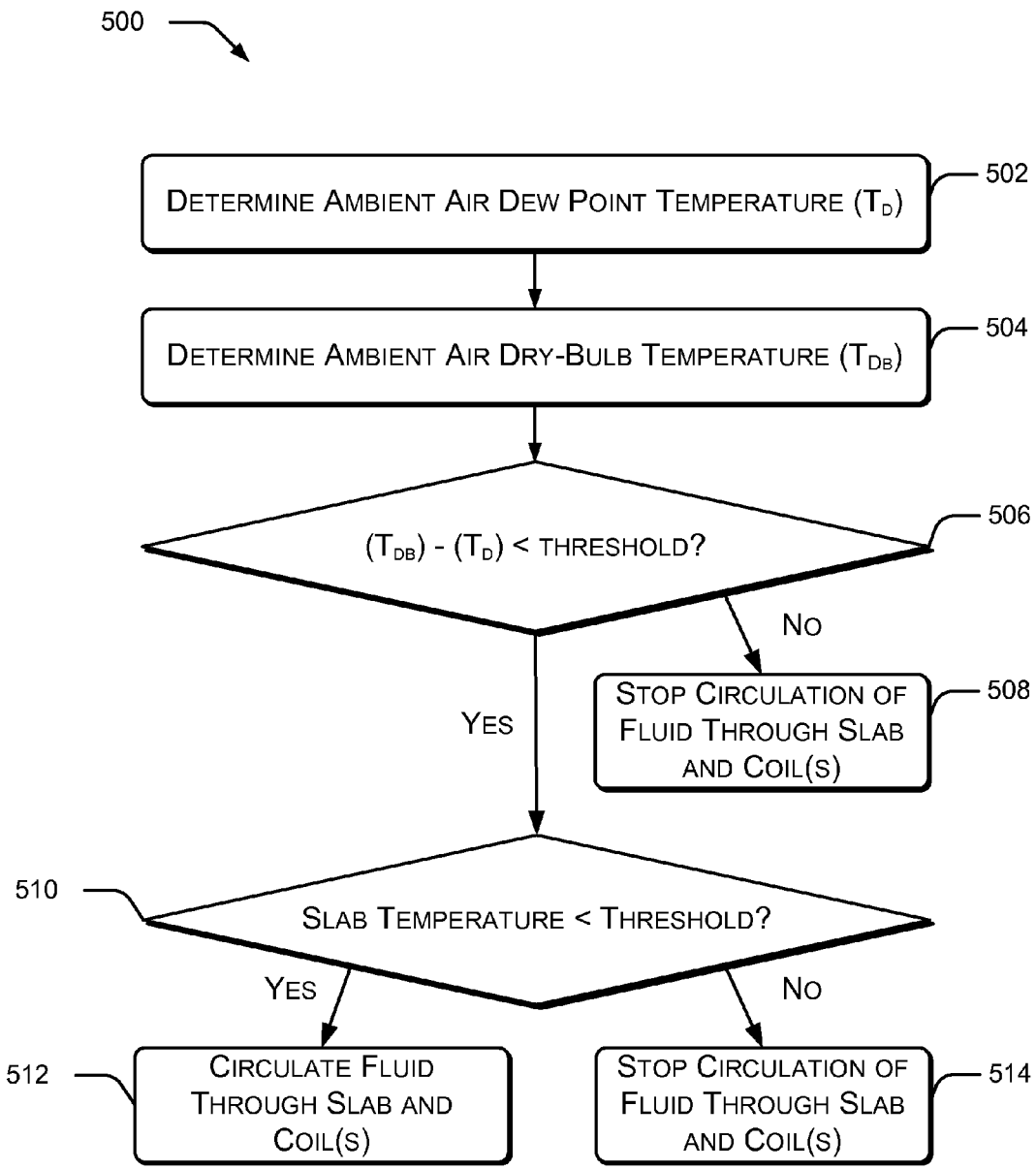
FIG. 5 is a flow diagram illustrating selective activation of a fluid circulation system including a slab and one or more coils.

FIG. 5 illustrates a process 500 for selectively activating the fluid circulating system 302.

At block 502, the dew point temperature $T_D$ of the ambient air, i.e., supply air, is determined and at block 504 the ambient air's dry-bulb temperature $T_{DB}$ is determined. These temperatures may be determined by one or more sensors, such as the sensor 220. These sensors may be temperature sensors and, for purposes of ascertaining the dew point temperature, for example, they may sense a relative humidity of the air. In one implementation, information from the sensors is communicated to the control unit 218, which stores the temperatures $T_D$, $T_{DB}$. The control unit 218 and/or the sensor(s) may also store or otherwise have access to information such as contained in a psychrometric chart, to calculate the dew point temperature.

At block 506, the difference between the dry bulb temperature and the dew point temperature is compared to a threshold value. An evaporative cooler cools air to an outlet temperature $T_O$ based on the wet-bulb and dry-bulb temperatures of the air entering the cooler and an efficiency E of the evaporative media used in the cooler. Specifically, the outlet temperature of air leaving the cooler is expressed as:

$$T_O = T_{DB} - ((T_{DB} - T_{WB}) * E) \quad (1)$$

As the wet-bulb temperature approaches the dry-bulb temperature, i.e., in relatively higher humidity environments where the dew point temperature is also relatively higher, the outlet temperature approaches the dry-bulb temperature, resulting in little to no evaporative cooling. Conversely, the greater the difference between the dry-bulb and the dew point temperatures, the larger the cooling effect. Thus, at block 506 if the difference between the dry-bulb temperature and the dew point temperature meets or exceeds a threshold value, the pump is deactivated (or not activated) at block 508 to stop coolant circulation. In this instance, sufficient cooling will be achieved without first conditioning the source air, so the coil is, in essence, turned off.

If at block 508 it is determined that the difference between the dry-bulb and dew point temperatures is below the threshold value, the fluid circulation system 302 may be turned on, i.e., the pump may be activated, to provide dehumidification to the source air. Thus, in some embodiments, the threshold value may be set at a level that in effect determines whether the cooling provided by the evaporative cooler will be sufficient without first dehumidifying the source air.

Although the pump may be activated upon a "YES" determination at block 506, the embodiment of FIG. 5 shows another inquiry. At block 510, a determination is made as to whether the slab temperature is below a slab temperature threshold. Such a determination may be made using one or more sensors, such as slab sensor 312. If the slab temperature is too high, e.g., because of continued circulation of the relatively warm coolant therethrough, it may become ineffective at cooling fluid in the fluid circulation system 302. Thus, in this instance, at block 514, circulation of the cooling fluid is stopped (or is not commenced). In contrast, if the slab temperature is below the threshold, i.e., the slab is not too warm, at block 512 the pump is turned on, and the cooling fluid is circulated through the system 302.

In some embodiments, blocks 502, 504, 506, and 510 are performed iteratively to provide continuous feedback about the system 302. In this manner, for example, the control unit 218 may optimize operation. For instance, the slab 110 can be allowed to dissipate heat until its temperature drops below the threshold. Other features may also be included in the data center to increase its performance.

Figure 6:
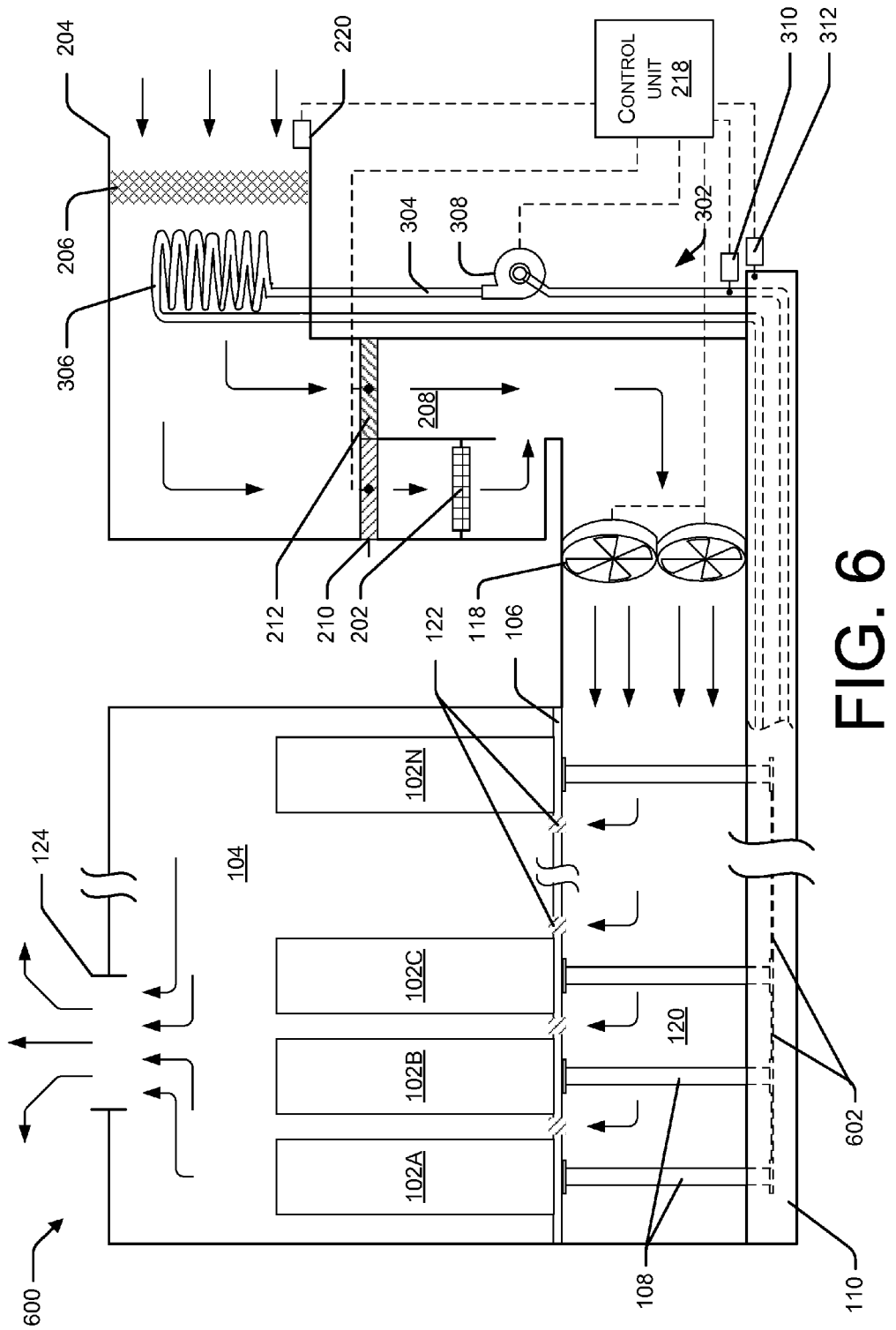
FIG. 6 illustrates a data center including an evaporative cooling system and a fluid circulation system in which stanchions are thermally coupled to a foundational slab.

For example, FIG. 6 illustrates another example of a data center 600 that promotes increased heat dissipation from the slab. In FIG. 6, the stanchions 108 are partially buried in the subfloor 110, instead of being placed on the subfloor 110. FIG. 6 also shows connecting ties 602 submerged in the subfloor 110 and providing a physical connection between the stanchions 108. The ties 602 and stanchions 108 preferably provide a continuous network that is thermally coupled to the subfloor 110, to aid in heat dissipation from the subfloor. In this manner, the stanchions 108 act as heat transfer fins. In one embodiment, the ties 602 may be formed from rebar, which is conventionally used to reinforce concrete. The ties 602 and stanchions 108 may be spaced sufficiently from the portions of the conduit 304 formed in the subfloor 110 so as to prevent heat transfer therebetween.

The stanchions (and in some embodiments the subfloor 110) of FIG. 6 will dissipate heat into the data center 600. Such an arrangement may slightly elevate air temperature around the stanchions (and the subfloor), which may prevent potentially harmful condensation of the relatively cold, moist air entering the space 120 from the evaporative cooler 202. In other embodiments modifications may be made to the subfloor to dissipate heat away from the data center, e.g., into the subsurface. For example, protrusions like the stanchions 108 (and accompanying ties) may be disposed in the slab 110 to extend into the subsurface, again, to act as heat transfer fins to dissipate the heat.

Figure 7:
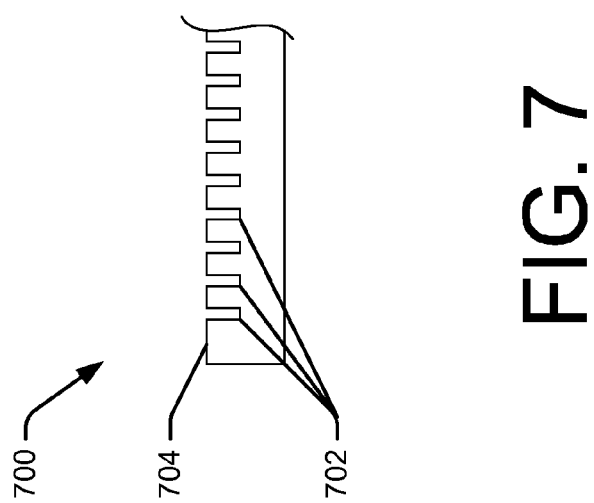
FIG. 7 illustrates a partial cross-section of a slab.

Other modifications may also be made. For example, one or more surfaces of the slab may be altered to increase heat transfer. FIG. 7 shows such an embodiment in which the slab is textured. More specifically, FIG. 7 shows a partial cross-section of a slab 700 that includes a plurality of notches 702 formed in a top surface 704. The notches 702 increase the surface area of the top surface 704, to aid in heat dissipation. In some embodiments, the notches 702 may be cast or cut into the top surface. In one implementation, the slab 700 may be used as the subfloor in a data center, such as described above. Although the notches 702 are illustrated as being formed in the top surface 704, they may alternatively or additionally be formed in other surfaces, such as a bottom surface exposed to a subsurface or foundation.

As will be appreciated with the benefit of this disclosure, other modifications may be made to increase the surface area of the slab. For example, texturing of the slab may be added by leaving the slab unfinished, or it may be finished to have an abrasive texture. These are alternative to a conventional smooth texture given to most data center slabs. In other embodiments, the surface area of the slab may be increased by including walls extending upwardly from the subfloor. In this instance, the slab and some or all of the walls preferably are disposed below grade.

As noted above, in some embodiments, the slab is a concrete slab which may be formed in situ or prefabricated. In some embodiments, the slab may be a ground-bearing slab, i.e., in direct contact with the subsoil or a barrier placed on the subsoil (such as hardcore or an insulating barrier). In such embodiments, the slab may dissipate heat directly into the subsoil. In other embodiments, the slab may be a suspended slab, such as existing between frames and/or on support structures.

Conventionally, concrete slabs are formed by pouring the concrete into a casting and allowing it to cure. In embodiments of this disclosure, a network of conduits comprising the conduit 304 is formed in the casting prior to pouring the slab. In this manner, the slab encapsulates or otherwise is formed around the conduit. Moreover, when used, portions of the stanchions 108 and/or the ties 602 may be disposed in the casting prior to pouring. Rebar or other bracing materials may also be used in the casting.

Figure 8:
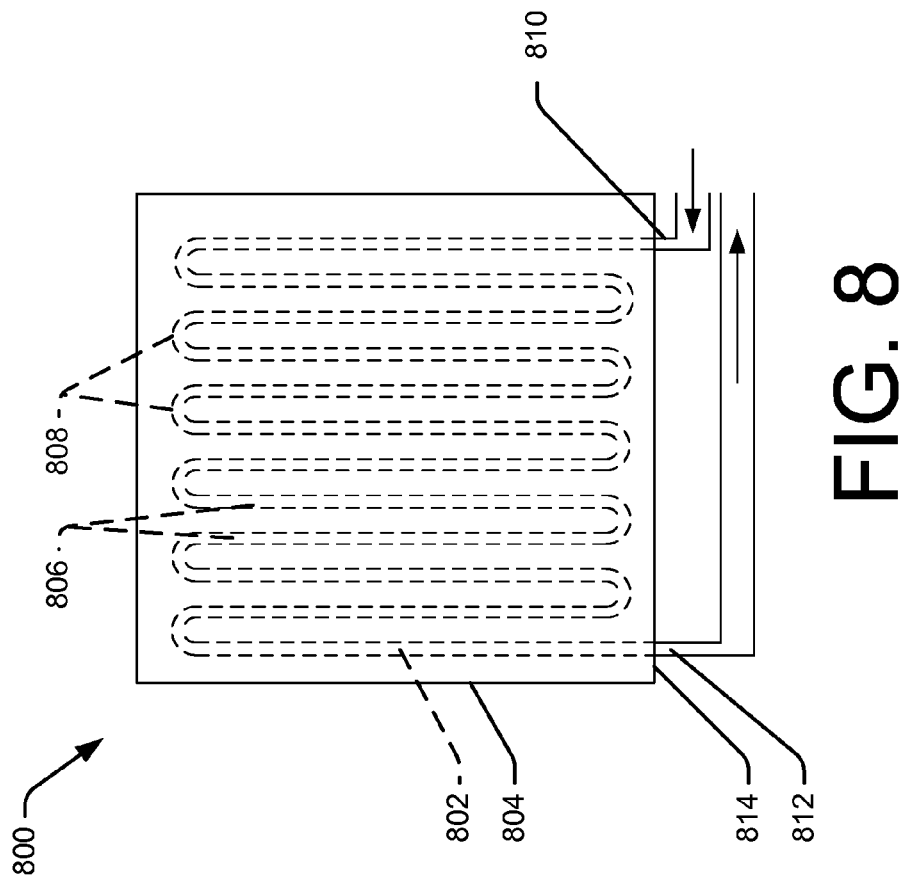
FIG. 8 is a top view of a slab with an integrated conduit through which a fluid may be circulated.

FIG. 8 illustrates one example arrangement 800 of a conduit 802 in a slab 804. As illustrated, the conduit 802 includes a plurality of spaced parallel runs 806 coupled by elbows 808 to form a continuous passageway through the slab 804. An inlet 810 and an outlet 812 are provided through a side 814 of the slab 804. In operation, fluid, such as water enters the conduit 802 through the inlet 810, circulates through the slab 804 to dissipate heat to the slab, and exits via the outlet 812. As will be appreciated, a portion of the conduit is disposed in the slab that is sufficient to promote heat dissipation. Thus, for example, in the embodiment of FIG. 8, a longitudinal axis of the conduit is substantially parallel to a plane of a top (and a bottom) of the slab, to achieve a relatively large contact area between the conduit and the slab. Arrangements other than the one illustrated may also achieve sufficient heat dissipation.

The disclosure is not limited to the conduit arrangement 800 of FIG. 8. For example, while FIG. 8 generally shows a two-dimensional arrangement, three-dimensional arrangements are also contemplated. In other embodiments, a plurality of inlets and outlets may be provided to multiple passageways through the slab. A manifold or the like may be provided to correlate flow to and from each of the passageways.

Other modifications also may be made to aspects of this disclosure. For example, although a slab is generally described as being used as a subfloor of a data center, the slab may form, in addition or alternatively, other aspects of the datacenter, such as walls or a main floor.

Moreover, the disclosure is not limited to the data center layouts described above and illustrated in the. Principles of this disclosure may be incorporated into other layouts, as will be appreciated by those having ordinary skill in the art educated with this disclosure. Moreover, principles of this invention may be implemented in data center pods, which are pre-fabricated, modular data centers and/or extensions for existing data centers. For example, the floor and/or walls of a data center pod may be formed to include a conduit therein through which a fluid may be circulated.

Conclusion

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A datacenter comprising:
a slab comprising a floor of the datacenter;
one or more heat-generating electronic components disposed above the slab;
an air conditioning system comprising:
an air inlet,
an evaporative cooling system downstream of and in fluid communication with the air inlet, and
an air outlet directing air over the one or more heat-generating electronic components; and
a fluid circulation system that is not in fluid communication with the evaporative cooling system, comprising:
a coil disposed in the air conditioning system upstream of the evaporative cooling system and downstream of the air inlet, and
a conduit in fluid communication with the coil and at least partly disposed in the slab.

2. The datacenter of claim 1, further comprising:
a pump configured to selectively circulate a fluid through the fluid circulation system.

3. The datacenter of claim 2, further comprising a control unit in communication with the pump controlling the pump to selectively circulate the fluid.

4. The datacenter of claim 3, further comprising one or more sensors positioned to sense one or more characteristics of the data center and in communication with the control unit to transmit the sensed one or more characteristics to the control unit.

5. The datacenter of claim 1, wherein a fluid is selectively circulated between the coil and the conduit based at least in part on a temperature of air entering the air conditioning system through the air inlet.

6. A system for conditioning air in a room, comprising:
an air inlet through which external air enters the system;
a ground-bearing slab;
an air cooler; and
a fluid circulation system upstream of the air cooler comprising:
a conduit disposed in the slab, the conduit not being in fluid communication with the air cooler, and
a coil disposed in the air inlet and in fluid communication with the conduit.

7. The system of claim 6, wherein the fluid circulation system further comprises a pump that circulates a fluid in the fluid circulation system.

8. The system of claim 7, further comprising a controller for selectively operating the pump to circulate the fluid through the fluid circulation system.

9. The system of claim 6, wherein the air cooler is a direct evaporative cooler.

10. The system of claim 6, wherein a portion of the conduit disposed in the slab has a longitudinal axis arranged substantially parallel to a top surface of the slab.

11. The system of claim 6, wherein the slab comprises a concrete slab.

12. The system of claim 6, wherein the slab is disposed as a subfloor beneath the room.

13. The system of claim 6, further comprising a primary floor disposed above a subfloor and supported by one or more stanchions.

14. The system of claim 13, wherein at least one of the stanchions or the slab is configured to dissipate heat into a space defined at least in part by the subfloor and the primary floor.

15. The system of claim 6, wherein the slab has a textured top surface.

16. The data center of claim 6, further comprising one or more heat transfer members thermally coupled to the slab to dissipate heat from the slab.

17. A method of cooling a data center comprising:
circulating a coolant through a closed system comprising a conduit disposed in a ground-bearing slab and a coil;
passing ambient air entering the data center over the coil to dehumidify the ambient air;
exposing the dehumidified air to an evaporative cooling system outputting cooled air, the evaporative cooling system not being in fluid connection with the coil; and
directing the cooled air into a space in the data center containing heat-generating components.

18. The method of claim 17, further comprising controlling a pump to selectively circulate the coolant through the closed system.

19. The method of claim 18, further comprising:
determining characteristics of at least one of the ambient air, the slab, and the coolant; and
selectively circulating the coolant based upon the characteristics.

20. The method of claim 19, wherein the coolant is selectively circulated when a difference between a dry-bulb temperature of the ambient air and a dew point temperature of the ambient air meets or exceeds a threshold value.

21. The method of claim 19, wherein the coolant is selectively circulated when a temperature of the slab is below a threshold slab temperature.

22. The method of claim 17, further comprising directing the cooled air into an intermediate space prior to directing the cooled air into the space containing heat-generating components.

23. The method of claim 22, further comprising dissipating heat into the intermediate space to inhibit formation of condensation in the intermediate space.

24. The method of claim 23, wherein the heat is dissipated into the intermediate space from at least one of the slab or a stanchion disposed on the slab.

* * * * *